(12) United States Patent
Yamamuro

(10) Patent No.: US 10,172,269 B2
(45) Date of Patent: Jan. 1, 2019

(54) CHUCK DEVICE AND COMPONENT MOUNTING MACHINE

(71) Applicant: FUJI MACHINE MFG. CO., LTD., Chiryu (JP)

(72) Inventor: Junichi Yamamuro, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 197 days.

(21) Appl. No.: 15/025,668

(22) PCT Filed: Oct. 7, 2013

(86) PCT No.: PCT/JP2013/077250
§ 371 (c)(1),
(2) Date: Mar. 29, 2016

(87) PCT Pub. No.: WO2015/052753
PCT Pub. Date: Apr. 16, 2015

(65) Prior Publication Data
US 2016/0295756 A1 Oct. 6, 2016

(51) Int. Cl.
*H05K 13/04* (2006.01)
*B23B 31/12* (2006.01)

(52) U.S. Cl.
CPC .......... *H05K 13/0408* (2013.01); *B23B 31/12* (2013.01); *H05K 13/0404* (2013.01); *B23B 2231/345* (2013.01)

(58) Field of Classification Search
CPC ...... H01L 2924/00; H01L 2924/00014; H05K 13/08; H05K 13/0413; H05K 13/0408;
(Continued)

(56) References Cited

U.S. PATENT DOCUMENTS 4,628,594 A    12/1986   Yamagami et al.
4,950,011 A *  8/1990    Borcea ............... H05K 13/0413
                                                        29/743
(Continued)

FOREIGN PATENT DOCUMENTS

JP      6-15591 A     1/1994
JP      6-24882 U     4/1994
(Continued)

OTHER PUBLICATIONS

International Search Report dated Dec. 3, 2013 in PCT/JP2013/077250 Filed Oct. 7, 2013.
(Continued)

*Primary Examiner* — Peter DungBa Vo
*Assistant Examiner* — John S Lowe
(74) *Attorney, Agent, or Firm* — Oblon, McClelland, Maier & Neustadt, L.L.P.

(57) ABSTRACT

A chuck device includes a plurality of types of chuck pawls clamping a component, a chuck pawl switching mechanism switching the chuck pawls in use among the plurality of types of chuck pawls in accordance with the type of the component to be clamped, and a driving mechanism allowing the chuck pawl switched by the chuck pawl switching mechanism to be put into a clamping operation. The chuck pawl switching mechanism is configured to use a cylindrical cam, the plurality of types of chuck pawls are placed at predetermined intervals around the cylindrical cam, a cam follower disposed in each of the chuck pawls is fitted into a cam groove in an outer peripheral surface of the cylindrical cam, and the respective chuck pawls are moved upward and downward independently of each other by the cylindrical cam being rotated.

15 Claims, 17 Drawing Sheets

(58) Field of Classification Search
CPC ........... H05K 13/0069; H05K 13/0404; H05K 13/0061; H05K 2203/0195
See application file for complete search history.

(56) References Cited

U.S. PATENT DOCUMENTS

| | | | |
|---|---|---|---|
| 6,085,893 A | 7/2000 | Asai et al. | |
| 7,159,307 B2 * | 1/2007 | Isogai | B23Q 17/005 |
| | | | 269/71 |

FOREIGN PATENT DOCUMENTS

| | | |
|---|---|---|
| JP | 8-8587 A | 1/1996 |
| JP | 2000-36694 A | 2/2000 |
| JP | 2009-200532 A | 9/2009 |
| JP | 2012-199315 A | 10/2012 |

OTHER PUBLICATIONS

Extended European Search Report dated Sep. 9, 2016 in Patent Application No. 13895286.6.

* cited by examiner

[Fig.1]
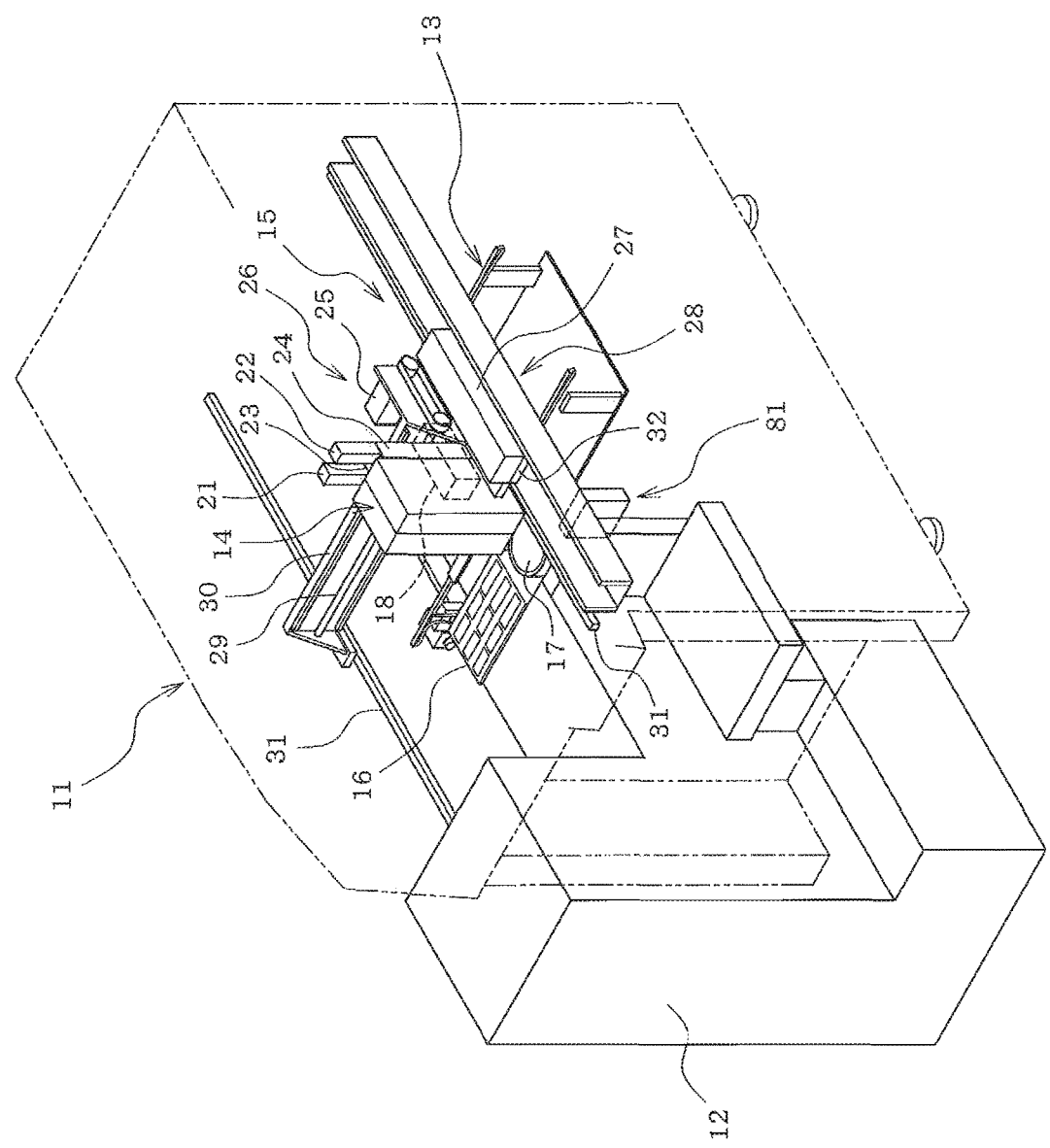

[Fig.2]
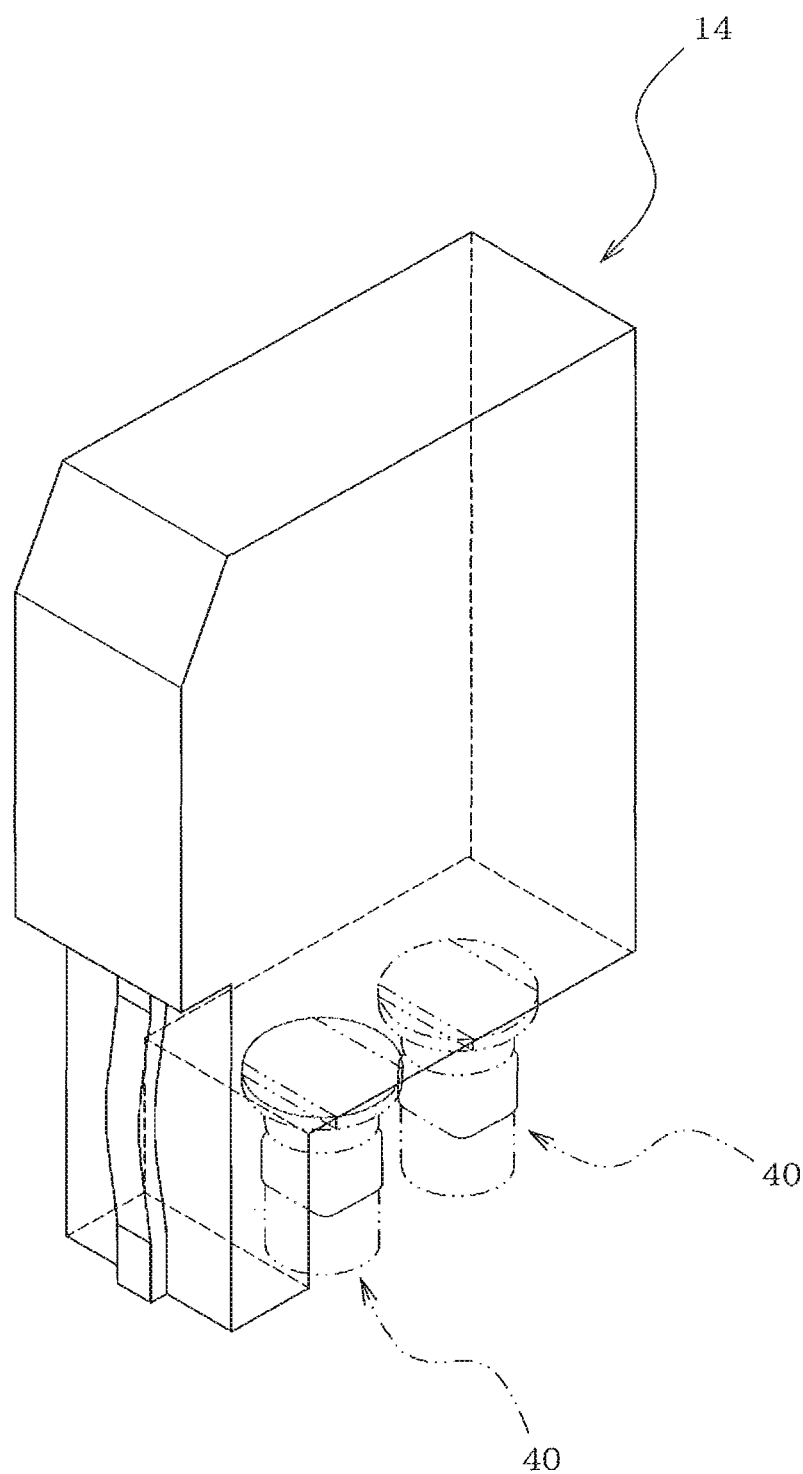

[Fig.3]
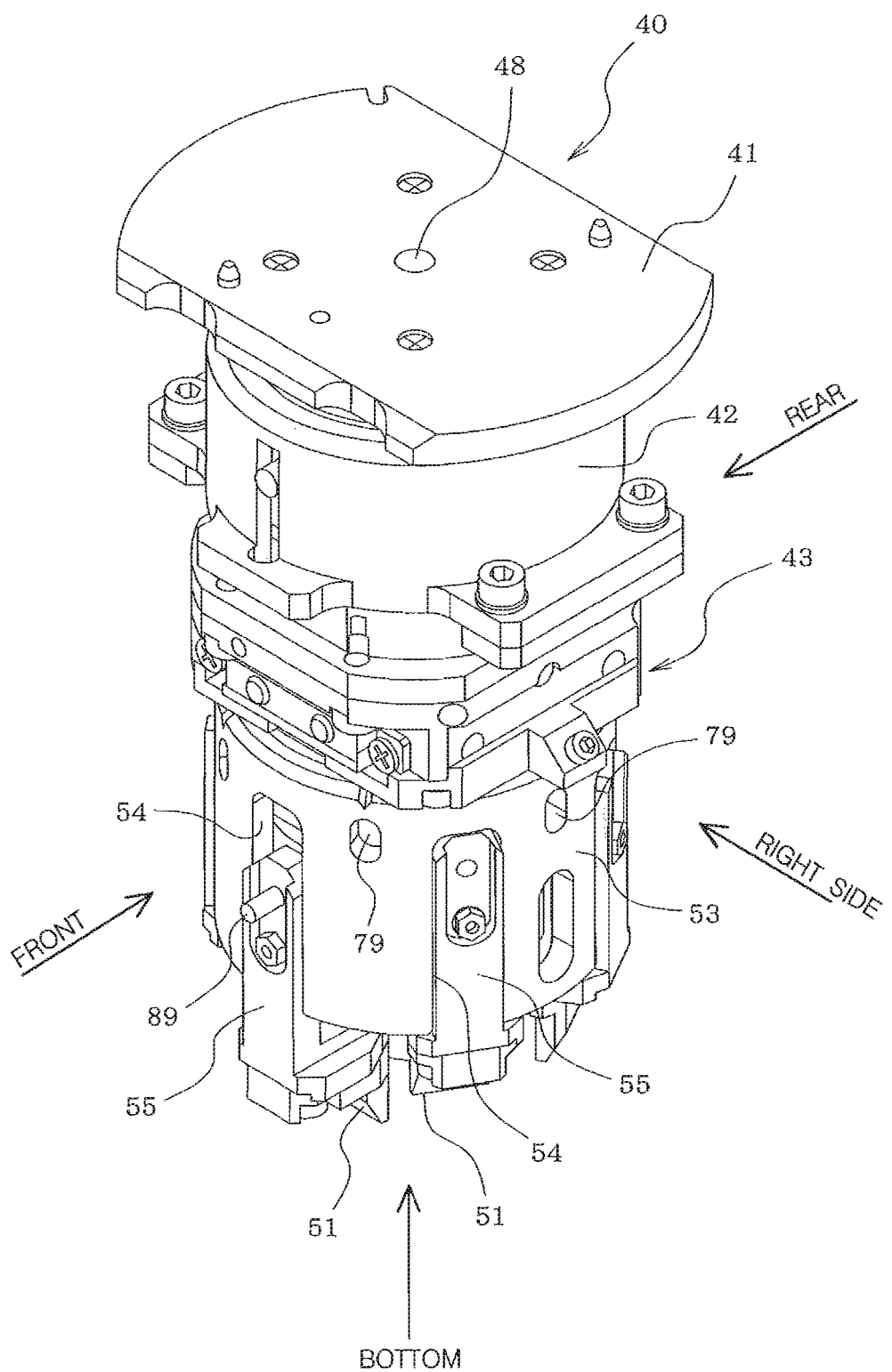

[Fig.4]
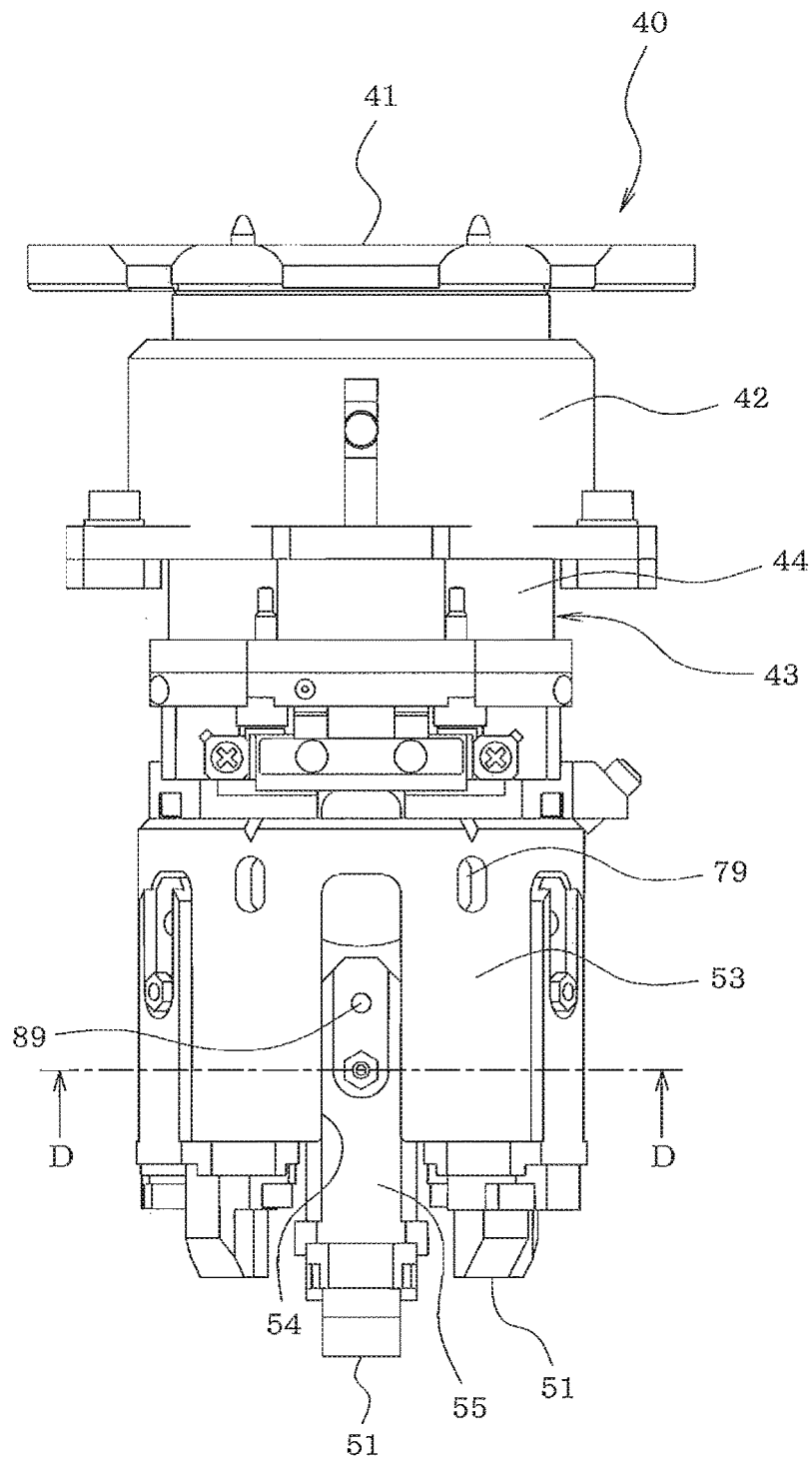
FRONT VIEW

[Fig.5]
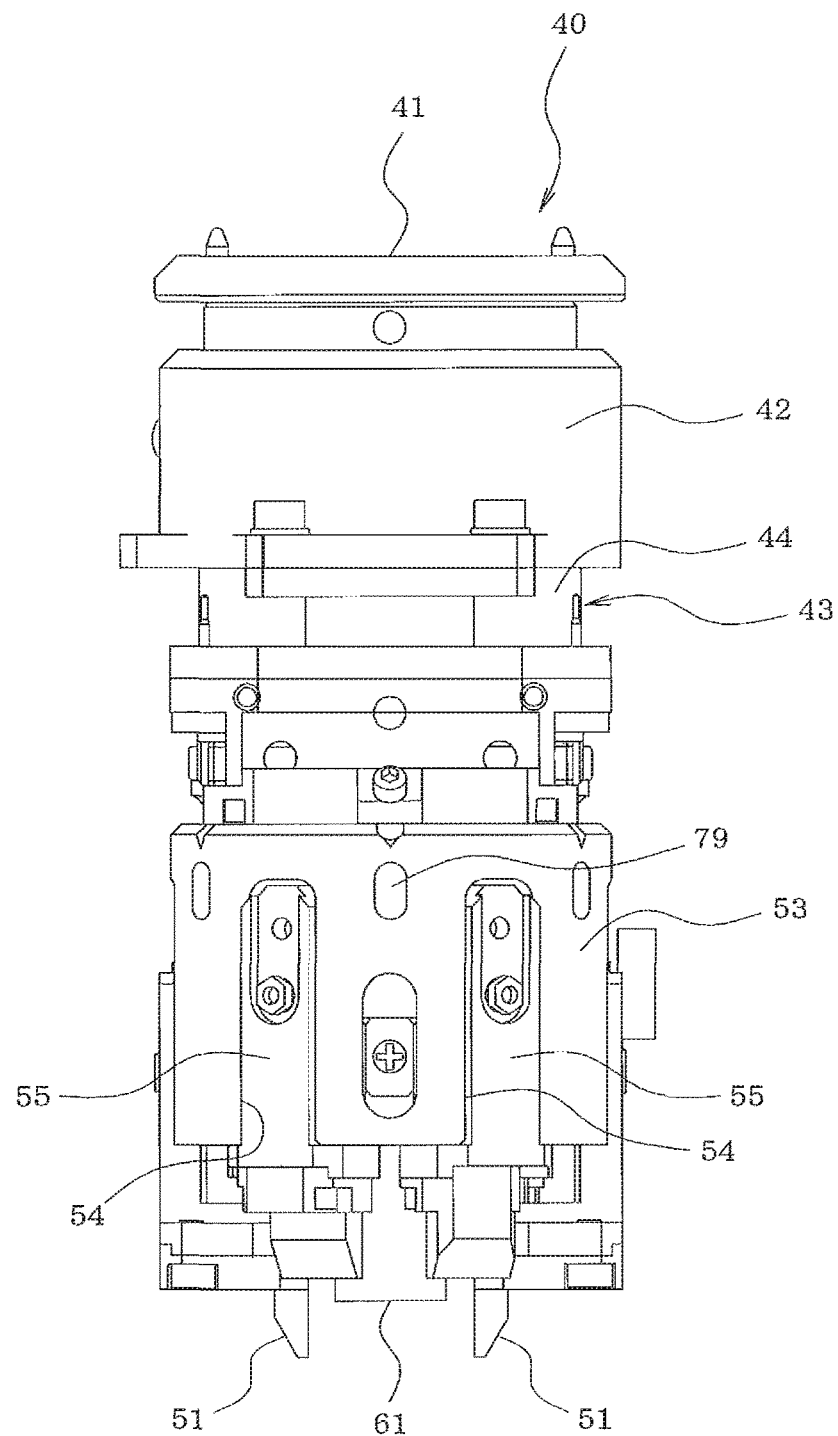
RIGHT SIDE VIEW

[Fig.6]
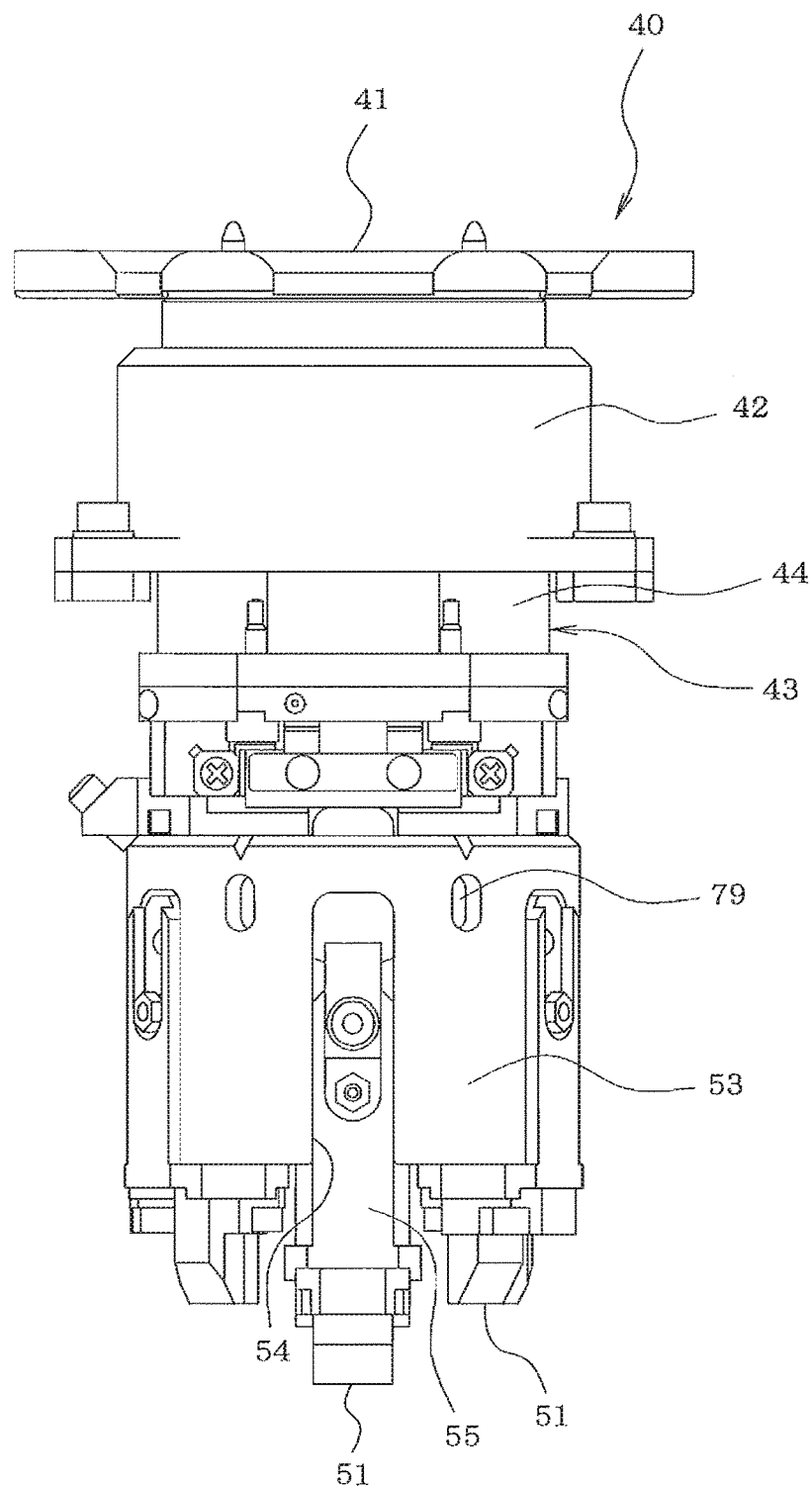
REAR VIEW

[Fig.7]
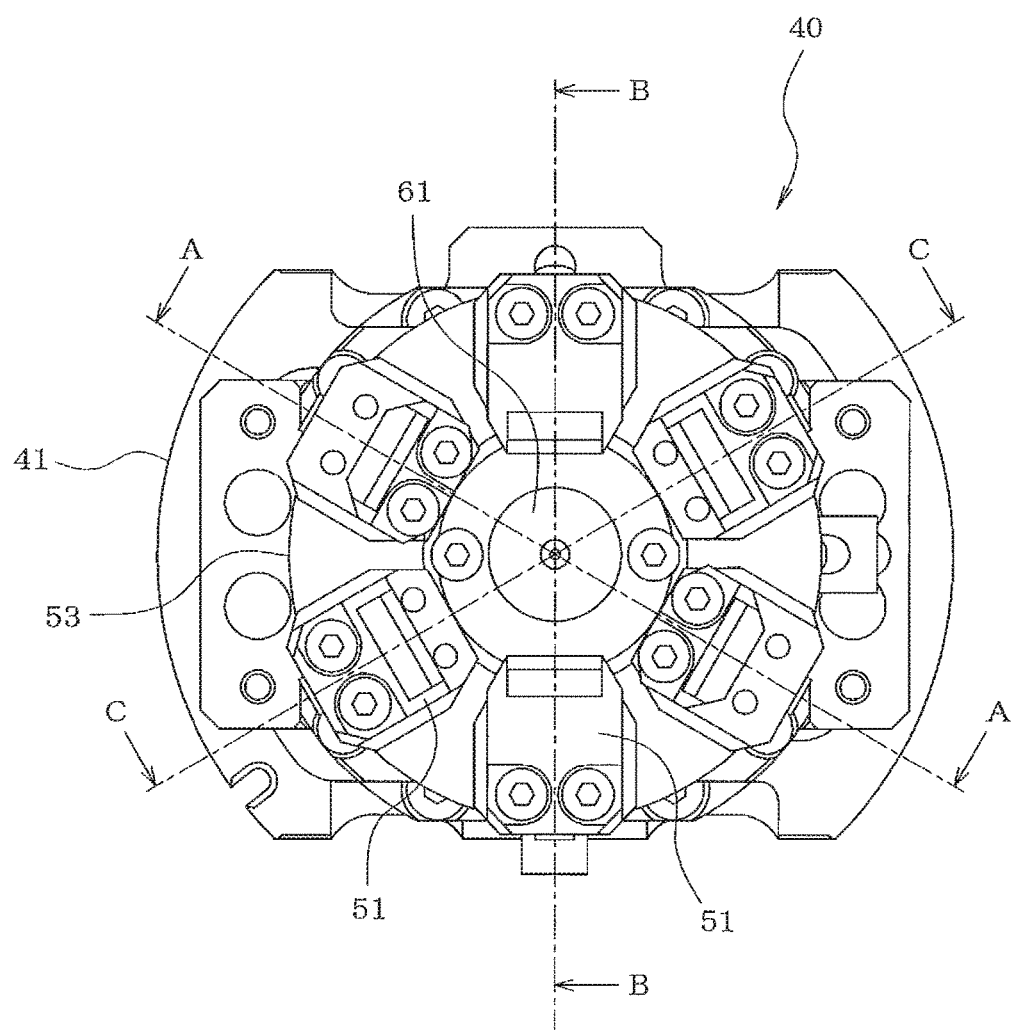
BOTTOM VIEW

[Fig.8]
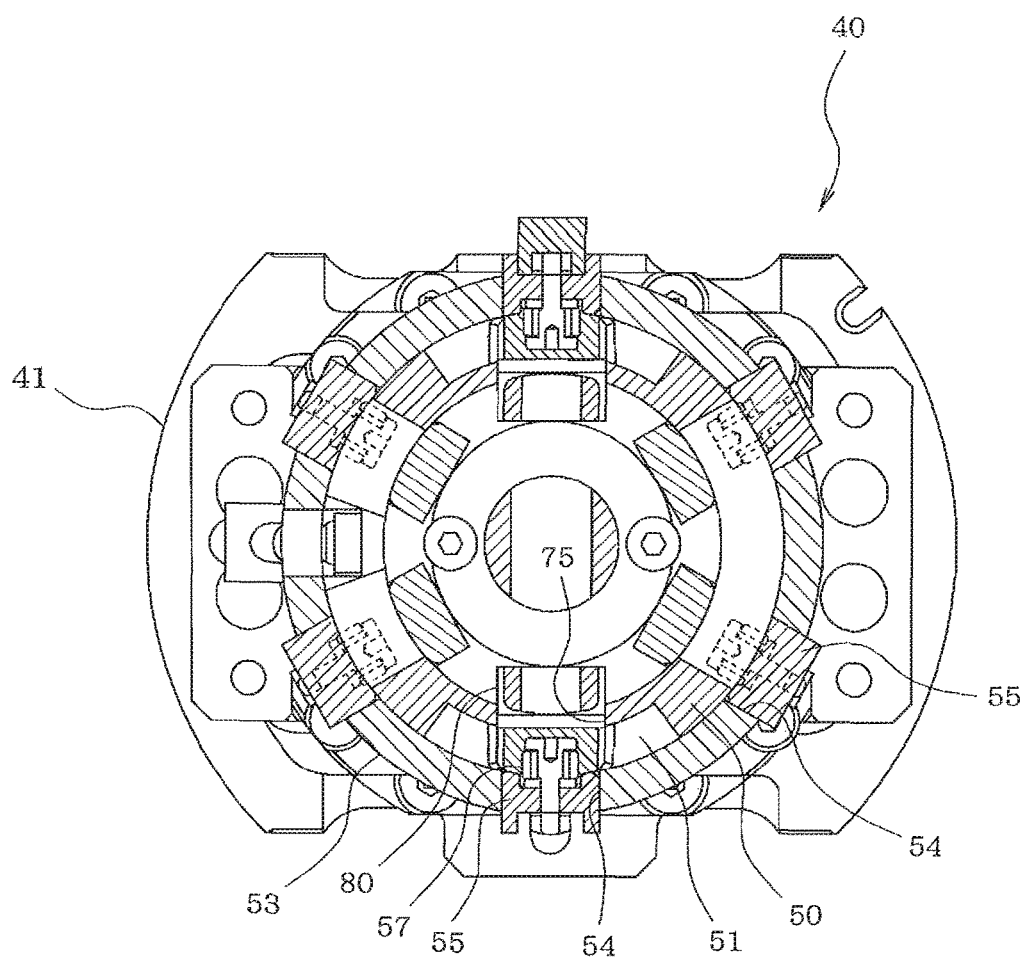
D-D CROSS-SECTIONAL VIEW

[Fig.9]
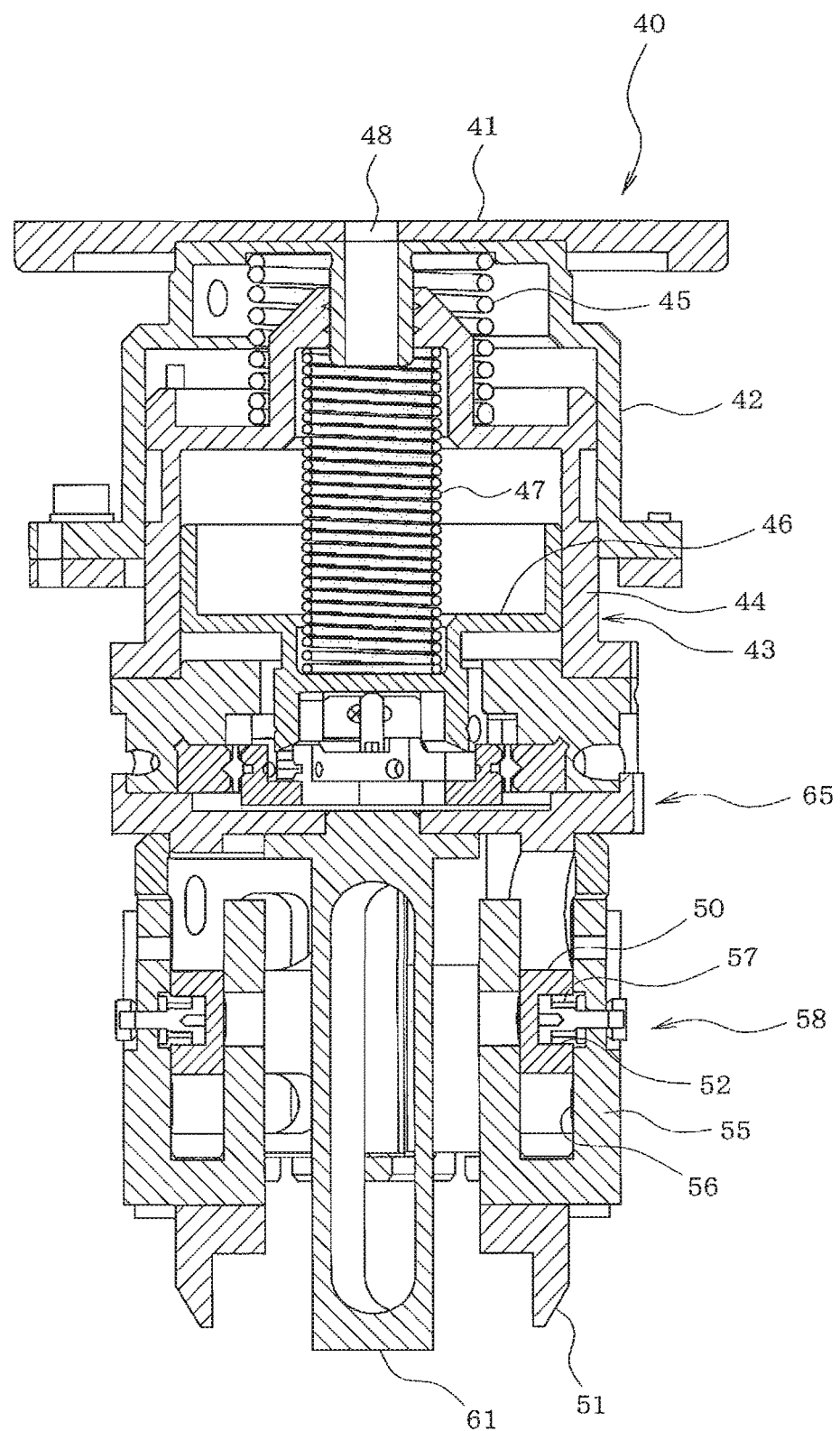
A-A CROSS-SECTIONAL VIEW

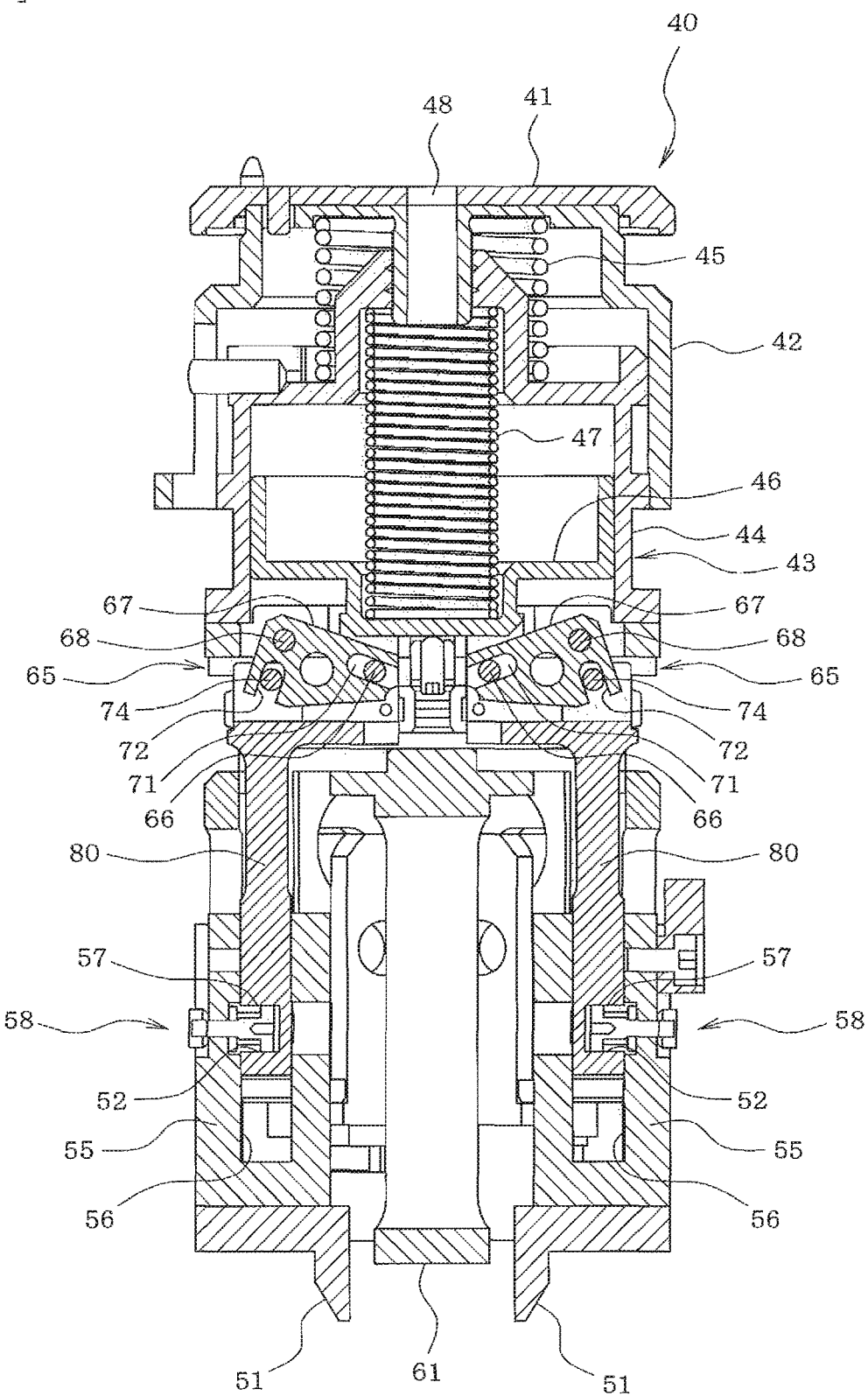
[Fig.10]
B-B CROSS-SECTIONAL VIEW

[Fig.11]
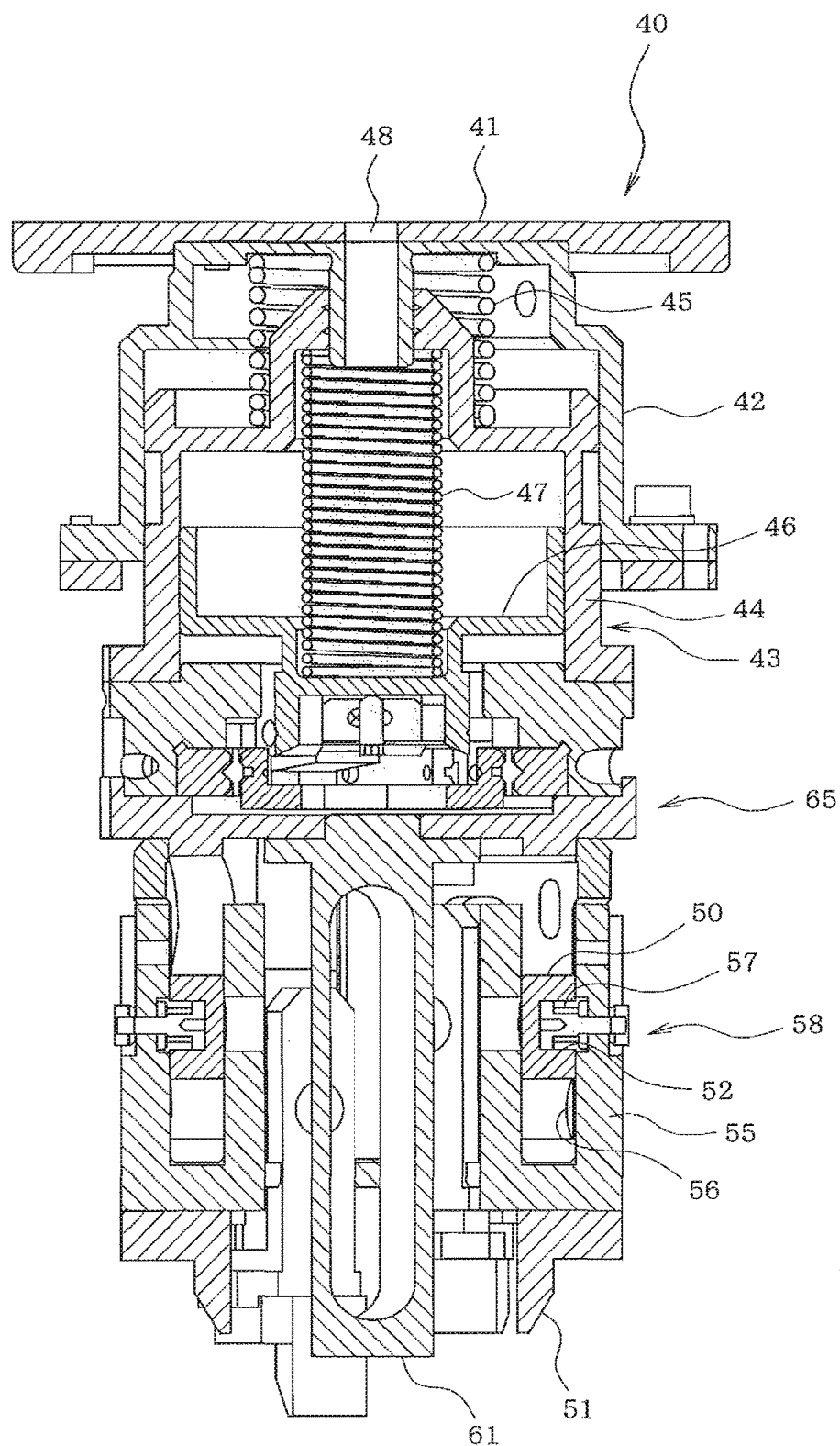
C-C CROSS-SECTIONAL VIEW

[Fig.12]
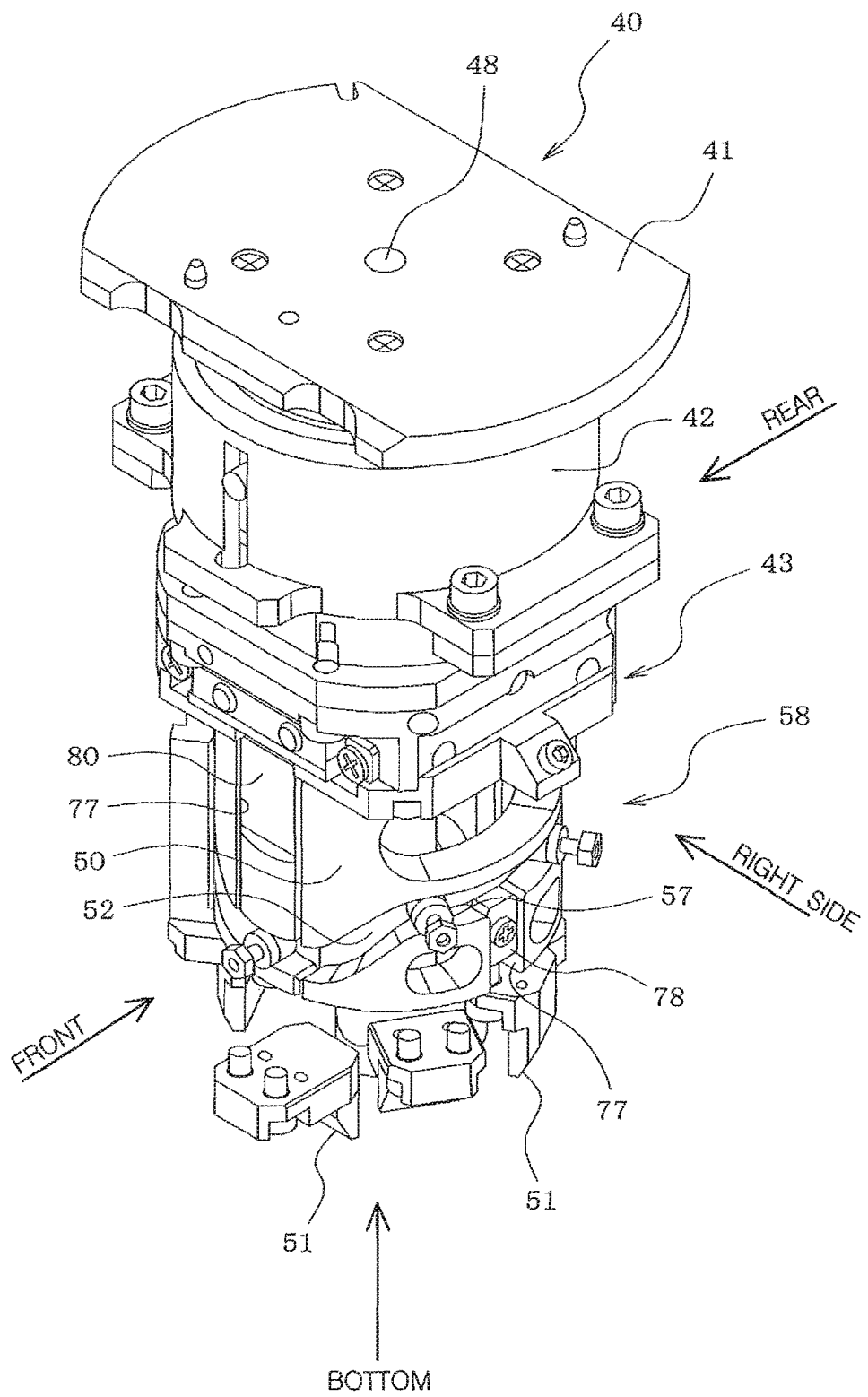

[Fig.13]
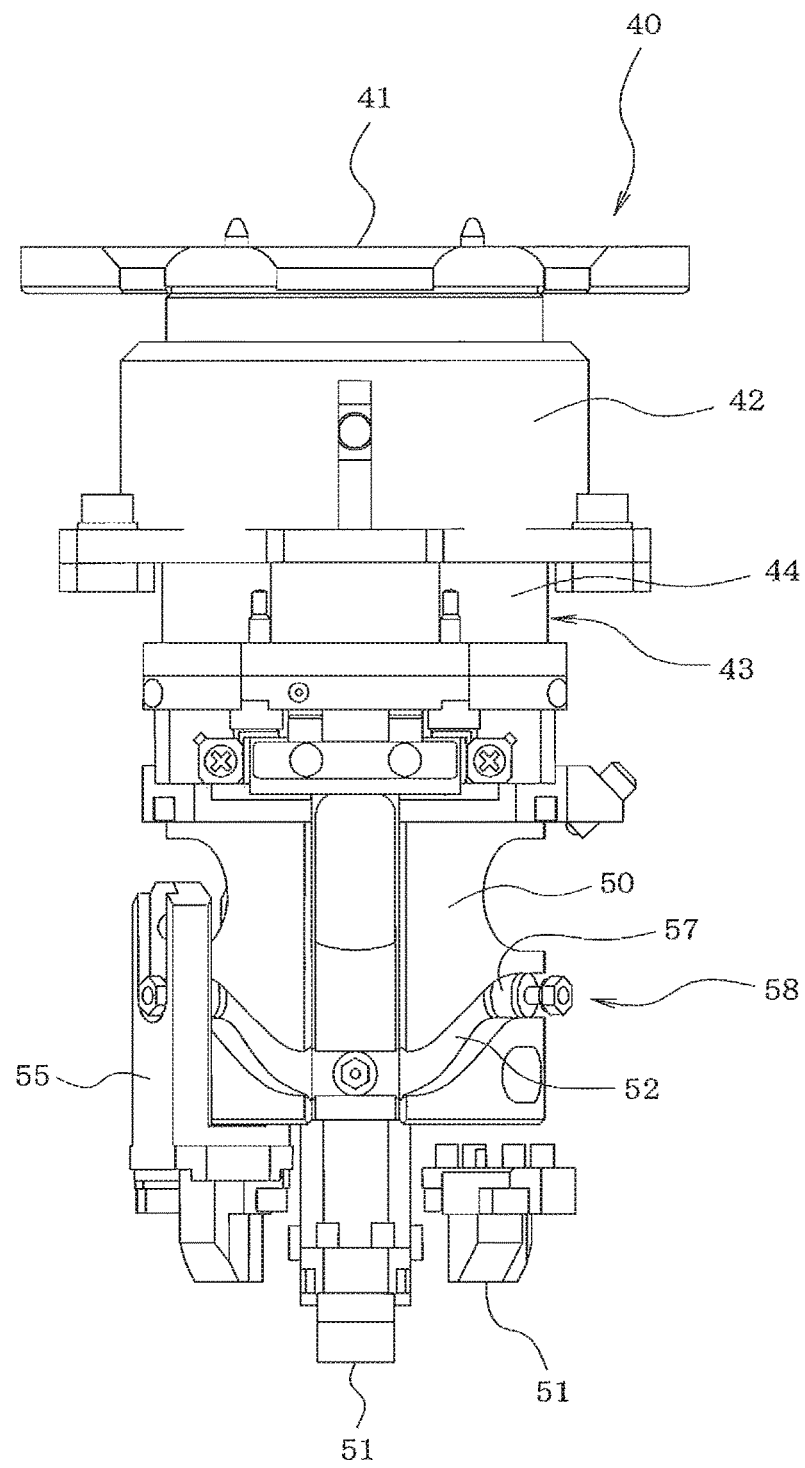
FRONT VIEW

[Fig.14]
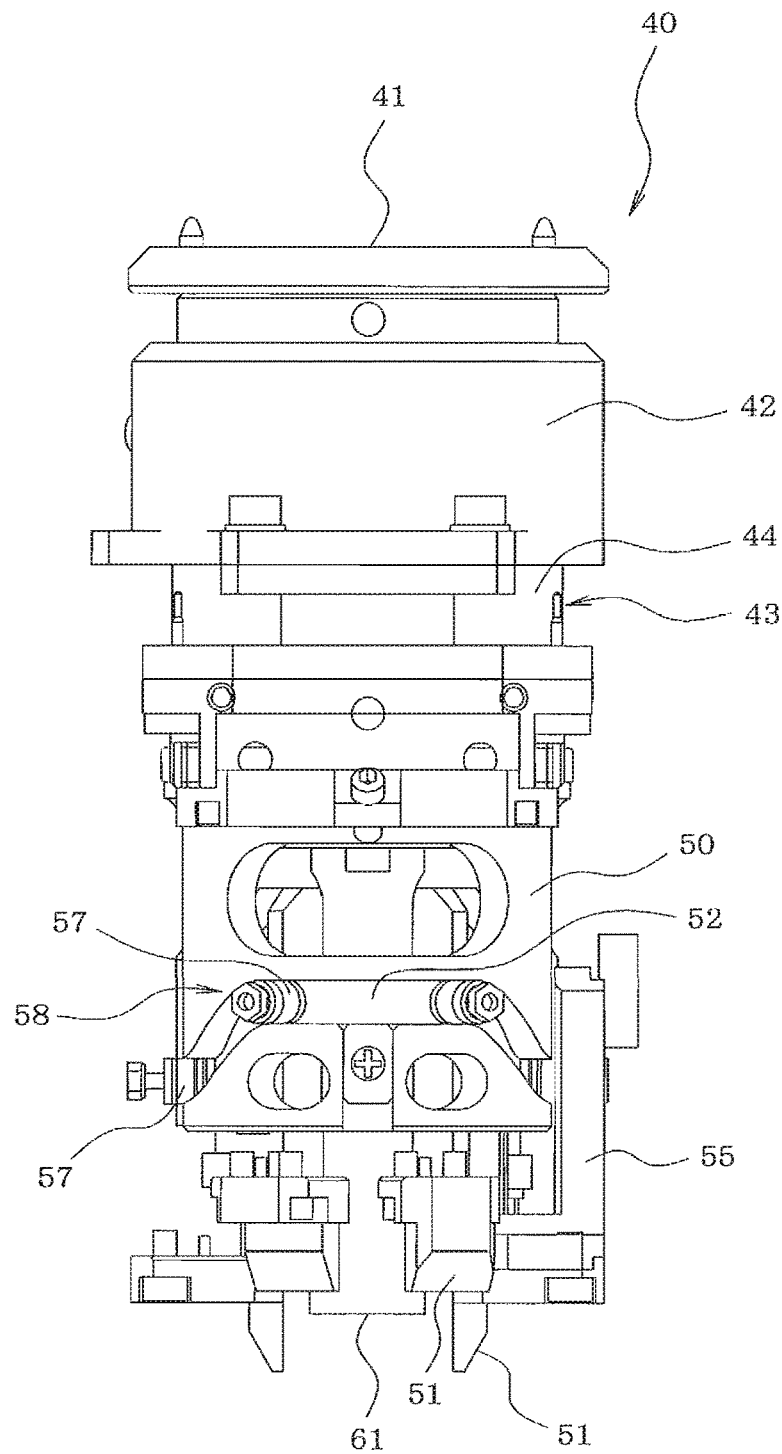
RIGHT SIDE VIEW

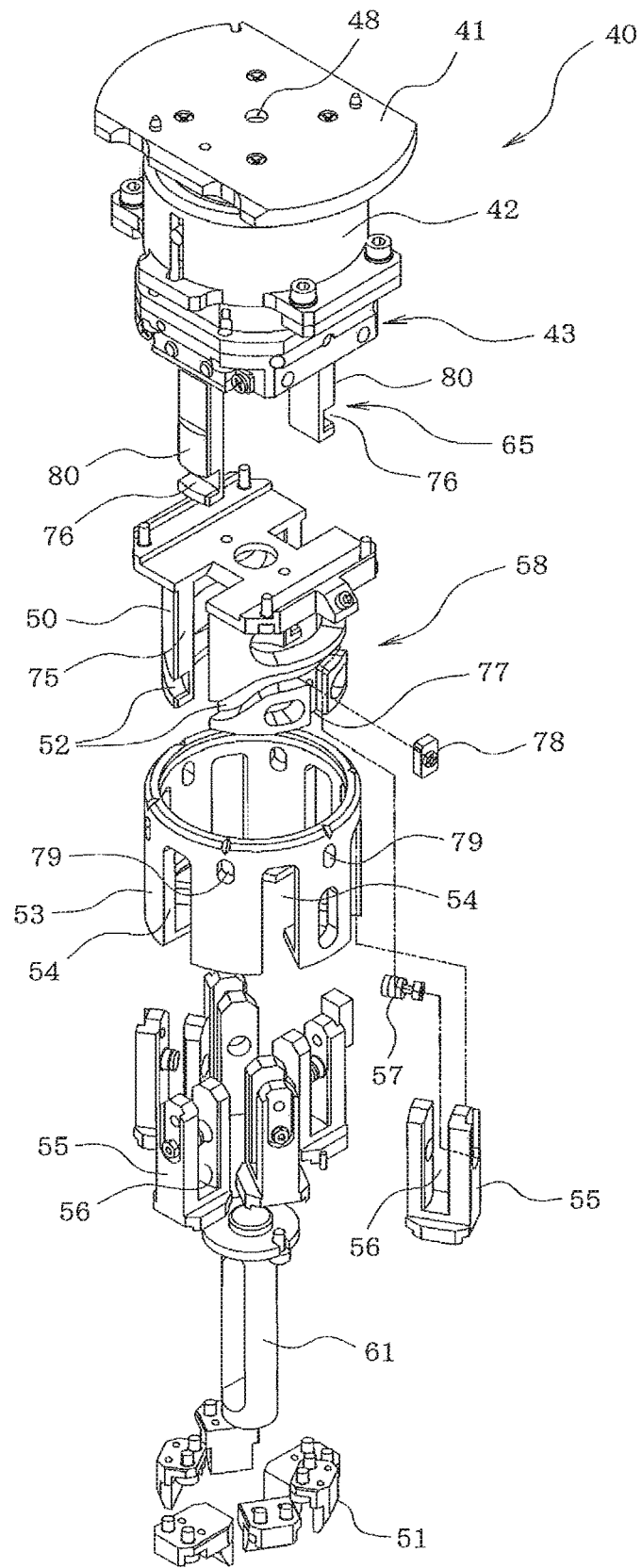
[Fig.15]

[Fig.16]
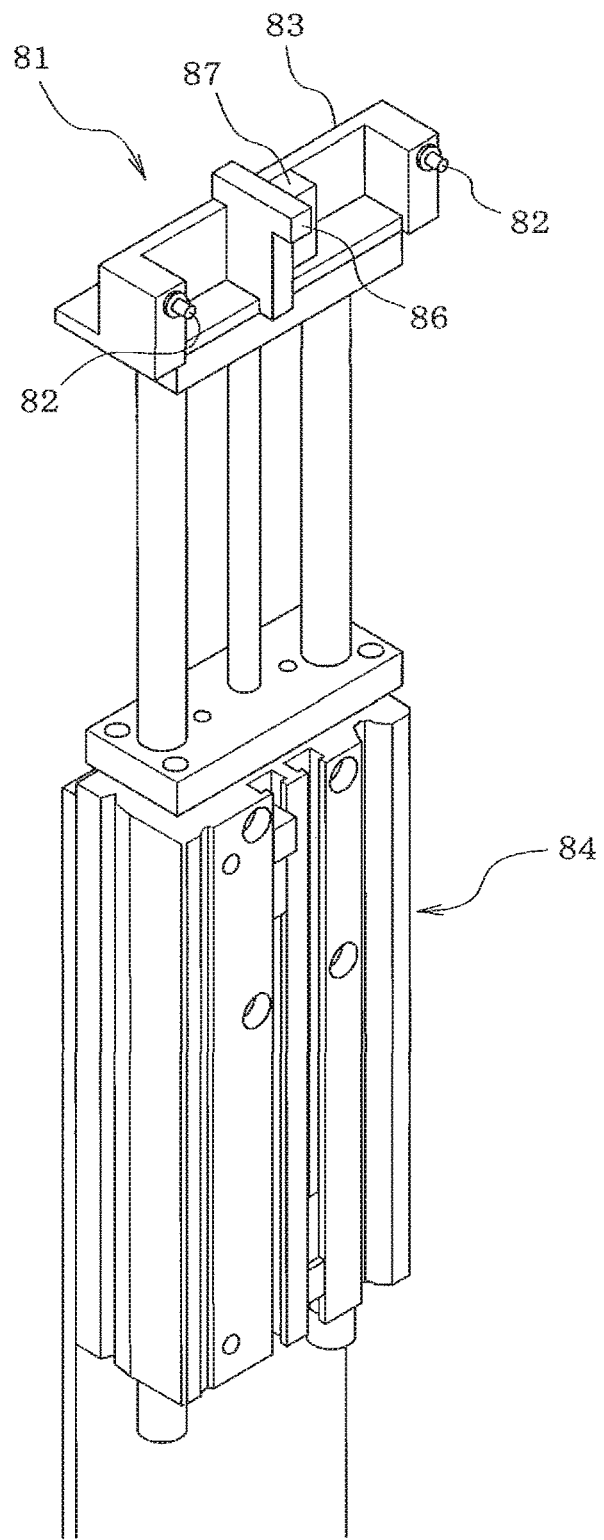

[Fig.17]
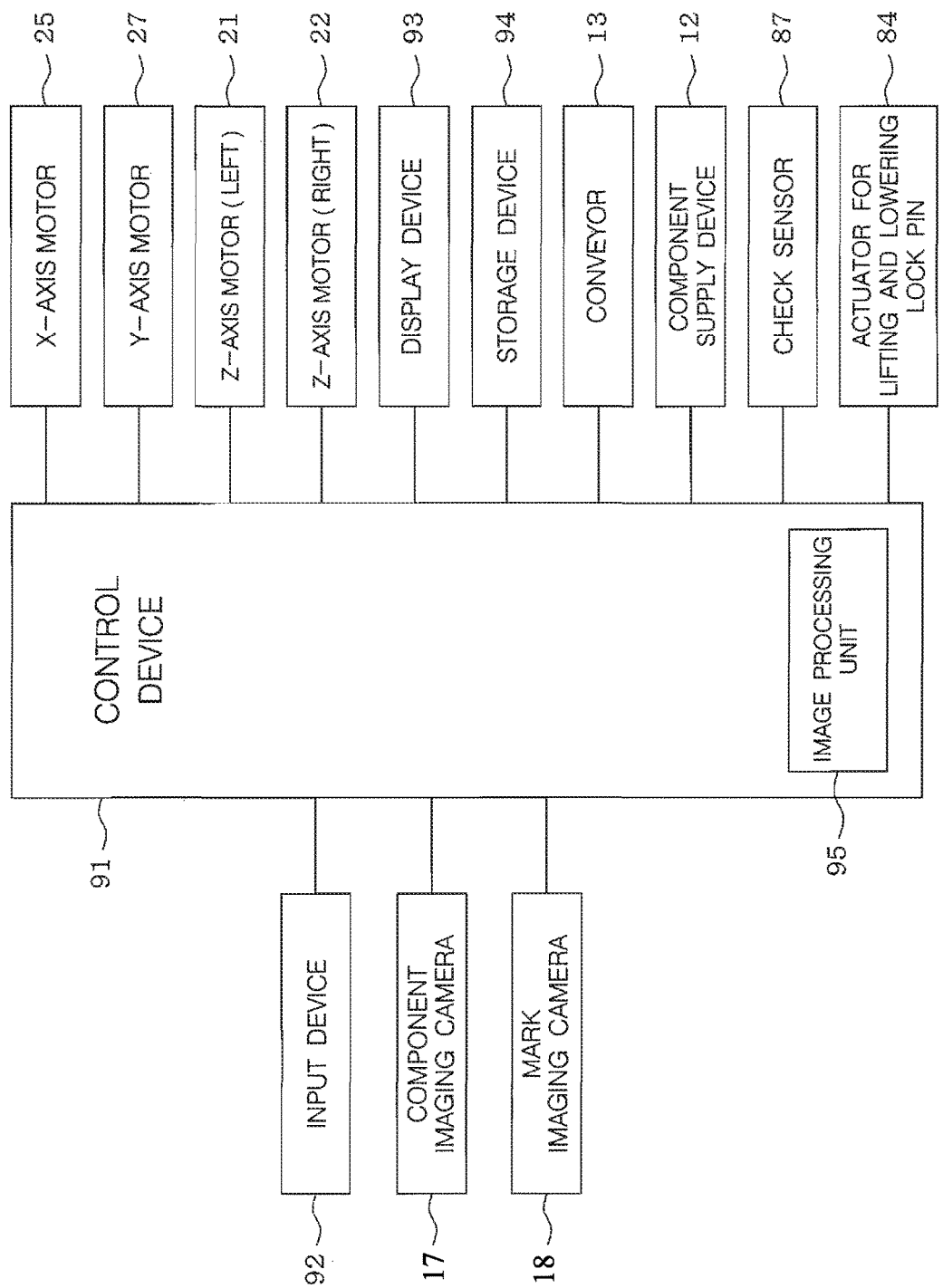

CHUCK DEVICE AND COMPONENT MOUNTING MACHINE

TECHNICAL FIELD

The present application relates to a chuck device that grips a component which is mounted on a circuit board or the like and a component mounting machine that holds the chuck device on a mounting head in an interchangeable manner.

BACKGROUND ART

When components are mounted on a circuit board or the like by a component mounting machine, a large component and a component which has a special shape less likely to be sucked by a suction nozzle are clamped and carried by chuck pawls of a chuck device. Although most chuck devices clamp the component from both sides with a pair of (two) chuck pawls, that disclosed in PTL 1 (JP-UM-A-6-24882) has two pairs of (four) chuck pawls placed at an interval of 90° and allows the two pairs of chuck pawls to be put into a clamping operation at the same time so that the component is clamped in four directions thereof.

CITATION LIST

Patent Literature

PTL 1: JP-UM-A-6-24882

BRIEF SUMMARY

Problem to be Solved

Each of the chuck devices configured as described above is limited in size and shape of the component that can be gripped by the single chuck device, and thus the chuck device is required to be replaced in accordance with the size and shape of the component to be clamped. Accordingly, the frequency with which the chuck device is replaced during production increases, productivity is reduced, and a larger number of types of chuck devices should be prepared, which leads to an increase in device cost.

An object of the present application is to provide a chuck device and a component mounting machine allowing the frequency with which a chuck device is replaced in accordance with the size and shape of a component to be clamped to be significantly reduced, productivity to be improved, a significantly smaller number of types of chuck devices to be prepared, and device costs to be reduced.

Means for Solving the Problem

In order to solve the above-described problem, a chuck device according to the present disclosure is configured to include a plurality of types of chuck pawls clamping a component, a chuck pawl switching mechanism switching the chuck pawls in use among the plurality of types of chuck pawls in accordance with the type of the component to be clamped, and a driving mechanism allowing the chuck pawl switched by the chuck pawl switching mechanism to be put into a clamping operation. In this configuration, a plurality of types of the chuck pawls are disposed in the single chuck device and the chuck pawls in use are switched by the chuck pawl switching mechanism in accordance with the type of the component to be clamped. Accordingly, a plurality of types of components that are different in size and shape can be clamped by the single chuck device. Accordingly, the frequency with which the chuck device is replaced in accordance with the size and shape of the component to be clamped can be significantly reduced and productivity can be improved. In addition, a significantly smaller number of types of the chuck devices are required to be prepared, which results in device cost reduction.

In this case, the chuck pawl switching mechanism may be configured to retract the chuck pawl not used among the plurality of types of chuck pawls to a retraction position not interfering with the clamping operation of the chuck pawl in use. Accordingly, an operation similar to that performed by a chuck device according to the related art provided with only one type of chuck pawl can be performed even by the chuck device provided with the plurality of types of chuck pawls.

Specifically, the plurality of types of chuck pawls may be configured to be supported such that the respective chuck pawls are moved upward and downward independently of each other, and the chuck pawl switching mechanism may be configured to lift the chuck pawl not used to the retraction position and lower the chuck pawl in use to a clamping operation position below the retraction position.

The chuck pawl switching mechanism may be configured to use a cylindrical cam, the plurality of types of chuck pawls may be configured to be placed at predetermined intervals around the cylindrical cam, a cam follower disposed in each of the chuck pawls may be configured to be fitted into a cam groove in an outer peripheral surface of the cylindrical cam, and the respective chuck pawls may be configured to be moved upward and downward independently of each other by the cylindrical cam being rotated. This configuration of the chuck pawl switching mechanism using the cylindrical cam allows the respective chuck pawls to be moved upward and downward independently of each other by a relatively simple configuration.

Specifically, a tubular guide member guiding the upward and downward movement of each of the chuck pawls may be concentrically placed on an outer peripheral side of the cylindrical cam, and the respective chuck pawls may be moved upward and downward independently of each other by the cylindrical cam being rotated in a state where rotation of the tubular guide member is locked.

Each of the chuck pawls may be disposed to be interchangeable with a different type of chuck pawl.

The driving mechanism allowing the clamping operation of the chuck pawl may use an electric actuator (such as a motor and a solenoid) or may use an air cylinder as a driving source.

In a case where the present disclosure is applied to a component mounting machine including a mounting head interchangeably holding a suction nozzle sucking a component, the chuck device may be interchangeably held by the mounting head.

In this case, air pressure may be supplied to the air cylinder of the chuck device through an air passage of the mounting head of the component mounting machine. Then, the chuck pawl of the chuck device can be allowed to perform the clamping operation using an existing air circuit of the component mounting machine.

The respective chuck pawls may be moved upward and downward independently of each other by the cylindrical cam being rotated based on rotation of a rotary shaft (Q shaft) of the mounting head. Then, the switching operation of the chuck pawl switching mechanism can be performed by the use of the existing rotary shaft (Q shaft) of the mounting head of the component mounting machine.

The component mounting machine may further include a rotation locking member locking the rotation of the tubular guide member when the chuck pawl in use is switched among the plurality of types of chuck pawls of the chuck device, and the respective chuck pawls may be moved upward and downward independently of each other by the cylindrical cam being rotated based on rotation of a rotary shaft of the mounting head in a state where the chuck device is moved to a predetermined position by the mounting head and the rotation of the tubular guide member is locked by the rotation locking member.

The component mounting machine may further include moving device for moving the rotation locking member, the rotation locking member may be moved to a position locking the rotation of the tubular guide member by the moving device during a chuck pawl switching operation for switching the chuck pawl in use among the plurality of types of chuck pawls of the chuck device, and the rotation locking member may be retracted to a position not interfering with the chuck device by the moving device after the chuck pawl switching operation is completed. Then, the chuck device moved by the mounting head can be reliably prevented from interfering with the rotation locking member during production subsequent to the completion of the chuck pawl switching operation.

A plurality of the chuck devices may be held by the mounting head of the component mounting machine and a plurality of rotary shafts rotating the cylindrical cams of the plurality of chuck devices may be disposed in the mounting head. A plurality of the rotation locking members may be disposed to correspond to the plurality of chuck devices. The respective chuck pawls of the plurality of chuck devices may be moved upward and downward independently of each other by the cylindrical cams of the plurality of chuck devices being rotated based on rotation of the plurality of rotary shafts of the mounting head in a state where the plurality of chuck devices are moved to a predetermined position by the mounting head and the rotation of the tubular guide members of the plurality of chuck devices is locked by the plurality of rotation locking members. Then, the chuck pawl switching operations of the plurality of chuck devices can be performed at the same time with the single mounting head, and the chuck pawl switching operations of the plurality of chuck devices can be efficiently performed in the period of time equivalent to the chuck pawl switching operation of the single chuck device.

The component mounting machine may be configured to further include a camera imaging an imaging target and image processing device for recognizing a position of the rotation locking member by imaging the rotation locking member or a reference position section disposed with a certain positional relationship with the rotation locking member with the camera and processing the image. In this case, the rotation of the tubular guide member can be reliably locked by the rotation locking member with the position of the rotation locking member confirmed by image processing and the chuck device accurately moved to the position where the rotation of the tubular guide member is locked, and a reliable chuck pawl switching operation can be performed.

The component mounting machine may be configured to further include a check sensor checking the chuck pawl switched by the chuck pawl switching mechanism. Then, even in a case where there is a mistake regarding the chuck pawls that are switched by the chuck pawl switching mechanism, the mistake can be detected by the check sensor and a component clamping failure, damage, and the like attributable to a wrong chuck pawl can be forestalled.

BRIEF DESCRIPTION OF DRAWINGS

FIG. 1 is a perspective view of a component mounting machine illustrating an embodiment of the present disclosure.

FIG. 2 is a perspective view of a mounting head.

FIG. 3 is a perspective view of a chuck device.

FIG. 4 is a front view of the chuck device.

FIG. 5 is a right side view of the chuck device.

FIG. 6 is a rear view of the chuck device.

FIG. 7 is a bottom view of the chuck device.

FIG. 8 is a cross-sectional view of the chuck device in FIG. 4 taken along line D-D.

FIG. 9 is a cross-sectional view of the chuck device in FIG. 7 taken along line A-A.

FIG. 10 is a cross-sectional view of the chuck device in FIG. 7 taken along line B-B.

FIG. 11 is a cross-sectional view of the chuck device in FIG. 7 taken along line C-C.

FIG. 12 is a perspective view illustrating a state where a tubular guide member and a pawl holder are removed from the chuck device.

FIG. 13 is a front view of the chuck device that is illustrated in FIG. 12.

FIG. 14 is a right side view of the chuck device that is illustrated in FIG. 12.

FIG. 15 is an exploded perspective view of the chuck device.

FIG. 16 is a perspective view of a rotation locking device.

FIG. 17 is a block diagram illustrating a configuration of a control system for the component mounting machine.

DESCRIPTION OF EMBODIMENTS

Hereinafter, a specific embodiment of the present disclosure will be described. Firstly, a configuration of a component mounting machine 11 will be described based on FIG. 1.

A component supply device 12 that supplies a component is detachably set on the component mounting machine 11. The component supply device 12 that is set on the component mounting machine 11 may be any one of a tray feeder, a tape feeder, a bulk feeder, a stick feeder, and the like. As a matter of course, the component supply device 12 that is set on the component mounting machine 11 may be a combination of a plurality of types of feeders. A conveyor 13 that conveys a circuit board (not illustrated), a mounting head 14 that allows the component supplied from the component supply device 12 to be mounted on the circuit board, an XY-axis moving mechanism 15 that moves the mounting head 14 in XY-axis directions (leftward, rightward, forward, and backward), a tool station 16 for the placement of tools for replacement (chuck device 40 for replacement and a suction nozzle for replacement), and the like are disposed in the component mounting machine 11.

The suction nozzle (not illustrated) that sucks the component which is supplied from the component supply device 12 and the chuck device 40 (refer to FIG. 3) that grabs, for example, a large component and a component which has a special shape less likely to be sucked by the suction nozzle are interchangeably held by the mounting head 14. A component imaging camera 17, which images the components held by the suction nozzle and the chuck device 40 from below, is disposed in the component mounting machine 11. A mark imaging camera 18, which images a fiducial position mark of the circuit board and the like, is disposed in the mounting head 14.

Two Z-axis slides 23 and 24, which are individually driven by two Z-axis motors 21 and 22, are disposed on the mounting head 14. The chuck device 40 is detachably held with a negative pressure or the like below each of the Z-axis slides 23 and 24 (refer to FIG. 2). The chuck devices 40 are moved upward and downward independently of each other by the respective Z-axis slides 23 and 24. Although not illustrated in the drawings, a Q shaft (rotary shaft) that rotates the chuck device 40 is assembled with each of the Z-axis slides 23 and 24.

An X-axis slide mechanism 26 that has an X-axis motor 25 which has a servomotor or the like as a driving source and a Y-axis slide mechanism 28 that has a Y-axis motor 27 which has a linear motor or the like as a driving source constitute the XY-axis moving mechanism 15. The X-axis slide mechanism 26 rotates an X-axis ball screw 29 with the X-axis motor 25 and moves an X-axis slide (not illustrated) where the mounting head 14 is mounted in the X-axis direction along an X-axis guide 30. The X-axis guide 30 is supported by a Y-axis guide 31 of the Y-axis slide mechanism 28 to be capable of sliding in the Y-axis direction, and the X-axis guide 30 is connected to a Y-axis slide 32 where the Y-axis motor 27 is mounted. In this manner, the X-axis slide mechanism 26 is moved in the Y-axis direction along the Y-axis guide 31 by the Y-axis motor 27.

Next, a configuration of the chuck device 40 will be described with reference to FIGS. 3 to 15. A holding plate section 41, which is held with a negative pressure or the like at a lower end of the Q shaft of the mounting head 14, is disposed at an upper end of the chuck device 40. A cylindrical outer case 42 is fixed to a lower surface side of the holding plate section 41. As illustrated in FIGS. 9 to 11, a cylinder case 44 of an air cylinder 43 is assembled inside the outer case 42 to be capable of moving upward and downward, and this cylinder case 44 is biased downward by a spring 45 (first biasing device).

A piston 46 is assembled in the cylinder case 44 to be capable of moving upward and downward, and this piston 46 is biased downward by a spring 47 (second biasing device). An air pressure introduction hole 48, which communicates with an air passage (not illustrated) of the mounting head 14, is formed in the holding plate section 41, and air pressure that is supplied through the air passage of the mounting head 14 (negative pressure or positive pressure) is introduced into the cylinder case 44 from the air pressure introduction hole 48 (refer to FIGS. 9 to 11). When the negative pressure is introduced into the cylinder case 44, the piston 46 is raised against a push-down force of the spring 47 because of a suction force of the negative pressure. When the positive pressure is introduced into the cylinder case 44, the piston 46 is pushed down by the positive air pressure and the push-down force of the spring 47.

A cylindrical cam 50 is concentrically fixed on a lower side of the cylinder case 44. Rotation of the Q shaft of the mounting head 14 causes the cylindrical cam 50 to rotate integrally with the holding plate section 41, the outer case 42, and the cylinder case 44. Cam grooves 52 for moving a total of six (three pairs of) chuck pawls 51 upward and downward are formed in an outer peripheral surface of the cylindrical cam 50.

A tubular guide member 53 that guides the upward and downward movements of the respective chuck pawls 51 is concentrically placed on an outer peripheral side of the cylindrical cam 50. An upper end portion of the tubular guide member 53 is supported to be capable of rotating with respect to the cylindrical cam 50. In the tubular guide member 53, guide grooves 54 (refer to FIG. 15) that guide the upward and downward movements of the respective chuck pawls 51 are formed at regular intervals at a pitch of 60°.

The chuck pawls 51 are interchangeably mounted by screwing or the like at respective lower ends of U-shaped pawl holders 55. In a case where the component is clamped with the chuck pawls 51, two (one pair) of the chuck pawls 51 that are positioned in a diametrical direction (diametrically opposed direction) of the chuck device 40 are selected from the six (three pairs of) chuck pawls 51 and used in accordance with the size and shape of the component. Accordingly, in a case where the number of the chuck pawls 51 that are assembled with the chuck device 40 is six in total as in this embodiment, three types (three pairs) of the chuck pawls 51 that are different in size and shape are mounted.

The pawl holders 55 are fitted into the respective guide grooves 54 of the tubular guide member 53 to be capable of moving upward and downward. U-shaped grooves 56 of the respective pawl holders 55 are fitted into the cylindrical cam 50 to be capable of sliding in a direction of rotation thereof. Cam followers 57 that are fixed to the respective pawl holders 55 are fitted into the cam grooves 52 in the outer peripheral surface of the cylindrical cam 50. Accordingly, when the cylindrical cam 50 is rotated in a state where rotation of the tubular guide member 53 is locked, the cam followers 57 of the respective pawl holders 55 move upward and downward in response to upward and downward movements of the cam grooves 52 of the cylindrical cam 50 and the respective chuck pawls 51 move upward and downward independently of each other.

The cam grooves 52 of the cylindrical cam 50 are configured such that only the two (one pair) of the chuck pawls 51 that are in use among the six (three pairs of) chuck pawls 51 in total are lowered to a lowermost position (clamping operation position) and protrude and the four (two pairs of) chuck pawls 51 that are not used are retracted to an uppermost position (retraction position) which does not interfere with a clamping operation of the chuck pawls 51 in use. The above-described cylindrical cam 50, cam followers 57, tubular guide member 53, and the like constitute a chuck pawl switching mechanism 58.

A height regulating member 61 for maintaining a constant height position of the chuck pawl 51 with respect to the clamped component is placed at a central position of the cylindrical cam 50. Accordingly, after a lower end of the height regulating member 61 abuts against an upper surface of the component during a lowering operation of the chuck device 40, only the holding plate section 41 and the outer case 42 are lowered in response to the lowering operation of the chuck device 40 and lowering of the other parts is forcibly stopped by the spring 45 in an upper portion of the chuck device 40 being compressed by the height regulating member 61, and lowering of the chuck pawls 51 is forcibly stopped as well.

Hereinafter, a configuration of a driving mechanism 65 that allows the two (one pair of) chuck pawls 51 in use to perform the clamping operation will be described with reference to FIG. 10. The driving mechanism 65 has the air cylinder 43 as a driving source, and two engaging pins 66 are fixed to both left and right sides of a lower surface side part of the piston 46 of the air cylinder 43. On both left and right sides of a lower surface side part of the cylinder case 44, two pivoting levers 67 are supported to be capable of pivoting in a vertical direction via two shaft pins 68. U-shaped engaging grooves 71 and 72 are formed on both sides of each of the pivoting levers 67. The engaging pin 66 of the piston 46 is slidably engaged with the engaging groove 71 inside each of the pivoting levers 67. Accordingly, the two pivoting levers 67 pivot in the vertical direction by using the two shaft pins 68 as fulcrums in response to an upward and downward movement of the piston 46.

The engaging grooves 72 on the outer sides of the two pivoting levers 67 are formed obliquely downward or downward, and two opening and closing levers 80 that are engaged with the engaging grooves 72 of the two pivoting levers 67 are placed on both diametrical sides of the cylindrical cam 50. Engaging pins 74 that are disposed at respective upper ends of the opening and closing levers 80 are slidably engaged with the engaging grooves 72 on the outer sides of the respective pivoting levers 67. Pivoting of the respective pivoting levers 67 causes the two opening and closing levers 80 to move in a diametrical direction of the cylindrical cam 50.

Cutout grooves 75 (refer to FIG. 15) are formed on both of the diametrical sides of the cylindrical cam 50, and the opening and closing levers 80 move into or out of the respective cutout grooves 75. When both of the opening and closing levers 80 are open (when both of the chuck pawls 51 are open), the pivoting levers 67 cause outer peripheral surfaces of the respective opening and closing levers 80 to be held at a position substantially corresponding to the outer peripheral surface of the cylindrical cam 50 and cam grooves 76 that are formed in lower portions of the respective opening and closing levers 80 become successive to the cam grooves 52 of the cylindrical cam 50. When both of the opening and closing levers 80 are closed (when both of the chuck pawls 51 are closed), both of the opening and closing levers 80 are moved inside the cylindrical cam 50 by the respective pivoting levers 67.

The two opening and closing levers 80 can be fitted into the U-shaped grooves 56 of the two pawl holders 55. In a state where the two opening and closing levers 80 are fitted into the U-shaped grooves 56 of the two pawl holders 55, the two opening and closing levers 80 are moved in the diametrical direction of the cylindrical cam 50, and thus the two pawl holders 55 are moved in the diametrical direction of the cylindrical cam 50, the two chuck pawls 51 fixed to the lower ends of the two pawl holders 55 undergo an opening and closing operation, and the component is clamped with the two chuck pawls 51 or released.

As illustrated in FIG. 15, introduction grooves 77 that reach the cam grooves 52 are formed to penetrate a lower portion of the outer peripheral surface of the cylindrical cam 50 downward. During assembly of the chuck device 40, the cam follower 57 is introduced to the cam groove 52 from the introduction groove 77, and then an obstruction piece 78 is fitted into the introduction groove 77 to be fixed by screwing or the like (refer to FIG. 12).

In addition, lock holes 79 that lock the rotation of the tubular guide member 53 during a chuck pawl switching operation are formed in the tubular guide member 53 at a predetermined pitch (such as a pitch of 60°).

As illustrated in FIGS. 1 and 16, a rotation locking device 81 is disposed at a predetermined position of the component mounting machine 11, and this rotation locking device 81 locks the rotation of the tubular guide member 53 of the chuck device 40 during the chuck pawl switching operation. A lifting and lowering member 83 that has two lock pins 82 (rotation locking members) mounted at both ends and an actuator 84 (moving device) such as an air cylinder and a motor lifting and lowering the lifting and lowering member 83 constitute the rotation locking device 81. The two lock pins 82 are set to have the same arrangement interval as the two chuck devices 40 held by the mounting head 14. The rotation of the tubular guide members 53 of the two chuck devices 40 is locked by the lock holes 79 of the tubular guide members 53 of the two chuck devices 40 being inserted into the two lock pins 82 during the chuck pawl switching operation.

At the center of the lifting and lowering member 83, a reference position mark section 86 (reference position section) for checking positions of the lock pins 82 at both ends of the lifting and lowering member 83 is disposed with a certain positional relationship with the lock pins 82 at both ends. The positions of the lock pins 82 at both ends of the lifting and lowering member 83 are checked, with a position of the reference position mark section 86 at the center of the lifting and lowering member 83 being used as a reference, by the reference position mark section 86 at the center of the lifting and lowering member 83 being imaged by the mark imaging camera 18 mounted on the mounting head 14, the image being processed by an image processing unit 95 (refer to FIG. 17), and the reference position mark section 86 being recognized.

In addition, a check sensor 87 is mounted on the lifting and lowering member 83 to check the chuck pawls 51 lowered to the lowermost position (clamping operation position) by the chuck pawl switching mechanism 58. A non-contact sensor such as a reflective optical sensor, a proximity sensor, and an ultrasonic sensor constitutes the check sensor 87. In a case where the chuck pawls 51 at the clamping operation position are checked with the check sensor 87, the type of the chuck pawl 51 is determined by the chuck device 40 being moved in front of the check sensor 87, the height position of the chuck pawl 51 being aligned with a height position of a detection area of the check sensor 87, the chuck pawl 51 being turned by the chuck device 40 being rotated by the Q shaft of the mounting head 14, the chuck pawl 51 being allowed to pass through the detection area of the check sensor 87, the length of time taken for the chuck pawl 51 to pass through the detection area of the check sensor 87 (the length of time taken for a detection signal of the chuck pawl 51 to be output from the check sensor 87) being measured, and a breadth of the chuck pawl 51 or a gap between the pair of chuck pawls 51 being calculated from the measured value in view of a turning speed of the chuck pawl 51.

In addition, a reference position pin 89 (refer to FIG. 3) is mounted on the pawl holder 55 of any one chuck pawl 51 of the six chuck pawls 51 assembled with the chuck device 40. Before the type of each of the chuck pawls 51 is checked with the check sensor 87, the position of the chuck pawl 51 where the reference position pin 89 is disposed is checked by the reference position pin 89 being detected by the check sensor 87. Then, when the type of each of the chuck pawls 51 is checked with the check sensor 87, the type of each of the chuck pawls 51 is checked with the check sensor 87 while the position of each of the chuck pawls 51 is determined with the position of the chuck pawl 51 where the reference position pin 89 is disposed being used as a reference.

As illustrated in FIG. 17, a control device 91 of the component mounting machine 11 has a computer as a main component, and an input device 92 such as a keyboard, a mouse, and a touch panel, a display device 93 such as an LCD, an EL, and a CRT, a storage device 94 storing various control programs and various types of data for controlling the component mounting machine 11, and the like are connected to the control device 91. In addition, the image processing unit 95, which processes images captured by a component imaging camera 17 and a mark imaging camera 18, is built into the control device 91.

The control device 91 controls an operation for mounting the component supplied from the component supply device 12 while the component mounting machine 11 is in operation on the circuit board by holding the component with the chuck device 40 (or the suction nozzle). In addition, the control device 91 controls the chuck pawl switching operation, which is to switch the chuck pawls 51 in use among the three pairs of chuck pawls 51 assembled with the chuck devices 40 by using the chuck pawl switching mechanism 58 in accordance with the type of the component to be clamped, as follows.

Firstly, the lifting and lowering member 83 is lifted to a chuck pawl switching operation position (uppermost position) by the actuator 84 being put into operation. Then, the reference position mark section 86 at the center of the lifting and lowering member 83 is imaged by the mark imaging camera 18 mounted on the mounting head 14, and the reference position mark section 86 is recognized by the image being processed by the image processing unit 95. Then, the positions of the lock pins 82 at both ends of the lifting and lowering member 83 are checked with the position of the reference position mark section 86 at the center of the lifting and lowering member 83 being used as a reference.

Then, the two chuck devices 40 held by the mounting head 14 are moved in front of the lock pins 82 at both ends of the lifting and lowering member 83, the lock holes 79 of the tubular guide members 53 of the two chuck devices 40 are inserted into the two lock pins 82, and then the rotation of the tubular guide members 53 of the two chuck devices 40 (turning of each of the pawl holders 55) is locked. The cylindrical cam 50 of each of the chuck devices 40 is rotated by the Q shaft of the mounting head 14 being rotated in this state. In this manner, the cam followers 57 of the respective pawl holders 55 are moved upward and downward in response to the upward and downward movement of the cam grooves 52 of the cylindrical cam 50, and the chuck pawls 51 move upward and downward independently of each other.

When the cylindrical cam 50 is rotated by 60° in a state where any one pair of chuck pawls 51 of the three pairs of chuck pawls 51 of the chuck device 40 are lowered to the lowermost position in this case, the one pair of chuck pawls 51 are lifted from the lowermost position to the uppermost position and a pair of the chuck pawls 51 adjacent thereto are lowered to the lowermost position. Accordingly, the cylindrical cam 50 is rotated until the one pair of chuck pawls 51 in use are lowered to the lowermost position.

Among the three pairs of chuck pawls 51 assembled with each of the chuck devices 40, the one pair of chuck pawls 51 used in accordance with the type of the component to be clamped are lowered to the lowermost position as described above, and then the tubular guide member 53 is unlocked by the lock holes 79 of the tubular guide member 53 of each chuck device 40 being withdrawn from the respective lock pins 82. Then, the chuck device 40 is moved in front of the check sensor 87 and the reference position pin 89 is detected with the check sensor 87, so that the position of the chuck pawl 51 where the reference position pin 89 is disposed is checked while the position of the chuck pawl 51 in use is checked with the position of the chuck pawl 51 where the reference position pin 89 is disposed being used as a reference.

Then, the height position of the chuck pawl 51 is aligned with the height position of the detection area of the check sensor 87, the chuck device 40 is rotated by the Q shaft of the mounting head 14, and the chuck pawl 51 is turned. Then, the chuck pawl 51 is allowed to pass through the detection area of the check sensor 87, and the length of time taken for the chuck pawl 51 to pass through the detection area of the check sensor 87 (the length of time taken for the detection signal of the chuck pawl 51 to be output from the check sensor 87) is measured. The breadth of the chuck pawl 51 is calculated from the measured value in view of the turning speed of the chuck pawl 51, and the type of the chuck pawl 51 is determined. In this manner, it is confirmed that the switching of the chuck pawls 51 is accurately performed. In a case where it is determined that there is a mistake in the switching of the chuck pawls 51, the chuck pawl switching operation described above is performed again.

After the chuck pawl switching operation is completed, the lifting and lowering member 83 is lowered to the lowermost position (retraction position) by the actuator 84. In this manner, the lock pins 82 and the check sensor 87 of the lifting and lowering member 83 are retracted to a position not interfering with the chuck device 40 after the chuck pawl switching operation is completed. Then, the operation for clamping the component supplied from the component supply device 12 with the chuck pawls 51 of the chuck device 40 and mounting the component on the circuit board is executed. In this case, the lock pins 82 and the check sensor 87 of the lifting and lowering member 83 are retracted to the position not interfering with the chuck device 40, and thus the chuck device 40 moved by the mounting head 14 can be reliably prevented from interfering with the lock pins 82 and the check sensor 87 of the lifting and lowering member 83.

In this embodiment described above, a plurality of types of the chuck pawls 51 are disposed in the single chuck device 40 and the chuck pawls 51 in use are switched by the chuck pawl switching mechanism 58 in accordance with the type of the component to be clamped. Accordingly, a plurality of types of components that are different in size and shape can be clamped by the single chuck device 40. Accordingly, the frequency with which the chuck device 40 is replaced in accordance with the size and shape of the component to be clamped can be significantly reduced and productivity can be improved. In addition, a significantly smaller number of types of the chuck devices 40 are required to be prepared, which results in device cost reduction.

In this embodiment, the chuck pawl switching mechanism 58 is configured to retract the chuck pawls 51 not used among the plurality of types of chuck pawls 51 to the retraction position not interfering with the clamping operation of the chuck pawls 51 in use. Accordingly, an operation similar to that performed by a chuck device according to the related art provided with only one type of chuck pawl can be performed even by the chuck device 40 provided with the plurality of types of chuck pawls 51.

In this embodiment, the air pressure is supplied to the air cylinder 43 of the chuck device 40 through the air passage of the mounting head 14 of the component mounting machine 11, and thus the chuck pawls 51 of the chuck device 40 can be allowed to perform the clamping operation using an existing air circuit of the component mounting machine 11. The present disclosure, however, may use an electric actuator (such as a motor and a solenoid) as the driving source for the clamping operation of the chuck pawl.

In this embodiment, the chuck pawls 51 are moved upward and downward independently of each other by the cylindrical cam 50 of the chuck device 40 being rotated based on the rotation of the Q shaft of the mounting head 14, and thus the switching operation of the chuck pawl switching mechanism 58 can be performed by the use of the existing Q shaft of the mounting head 14 of the component mounting machine 11. The present disclosure, however, may use an electric actuator (such as a motor and a solenoid) as the driving source for the chuck pawl switching mechanism.

In this embodiment, the two chuck devices 40 are held by the mounting head 14 of the component mounting machine 11, the two Q shafts are disposed to rotate the cylindrical cams 50 of the two chuck devices 40, the two lock pins 82 are disposed to correspond to the two chuck devices 40, and the respective chuck pawls 51 of the two chuck devices 40 are moved upward and downward independently of each other by the cylindrical cams 50 of the two chuck devices 40 being rotated based on the rotation of the two Q shafts of the mounting head 11 in a state where the two chuck devices 40 are moved to a predetermined position by the mounting head 14 and the rotation of the tubular guide members 53 of the two chuck devices 40 is locked by the two lock pins 82. Accordingly, the chuck pawl switching operations of the two chuck devices 40 can be performed at the same time with the single mounting head 14, and the chuck pawl switching operations of the two chuck devices 40 can be efficiently performed in the period of time equivalent to the chuck pawl switching operation of the single chuck device 40.

It is a matter of course that the present disclosure may also be configured such that three or more chuck devices 40 are held by the single mounting head 14 or may also be configured such that only one chuck device 40 is held by the single mounting head 14.

In this embodiment, the chuck pawls 51 that are switched by the chuck pawl switching mechanism 58 are checked by the check sensor 87. Accordingly, even in a case where there is a mistake regarding the chuck pawls 51 that are switched by the chuck pawl switching mechanism 58, the mistake can be detected by the check sensor 87 and a component clamping failure, damage, and the like attributable to a wrong chuck pawl 51 can be forestalled.

The present disclosure is not limited to the configuration of the above-described embodiment. It is a matter of course that the present disclosure can be modified in diverse forms without departing from the scope of the present disclosure. For example, the configuration of the chuck pawl switching mechanism and the configuration of the driving mechanism for the clamping operation of the chuck pawls may be appropriately changed, and the number of the chuck pawls assembled with the chuck device may be appropriately changed.

REFERENCE SIGNS LIST

11 . . . component mounting machine, 12 . . . component supply device, 13 . . . conveyor, 14 . . . mounting head, 15 . . . XY-axis moving mechanism, 17 . . . component imaging camera, 18 . . . mark imaging camera, 21, 22 . . . Z-axis motor, 23, 24 . . . Z-axis slide, 25 . . . X-axis motor, 26 . . . X-axis slide mechanism, 27 . . . Y-axis motor, 28 . . . Y-axis slide mechanism, 40 . . . chuck device, 41 . . . holding plate section, 43 . . . air cylinder, 45 . . . spring (first biasing device), 46 . . . piston, 47 . . . spring (second biasing device), 48 . . . air pressure introduction hole, 50 . . . cylindrical cam, 51 . . . chuck pawl, 52 . . . cam groove, 53 . . . tubular guide member, 54 . . . guide groove, 55 . . . pawl holder, 57 . . . cam follower, 58 . . . chuck pawl switching mechanism, 61 . . . height regulating member, 65 . . . driving mechanism, 67 . . . pivoting lever, 72, 73 . . . engaging groove, 79 . . . lock hole, 80 . . . opening and closing lever, 81 . . . rotation locking device, 82 . . . lock pin (rotation locking member), 83 . . . lifting and lowering member, 84 . . . actuator (moving device), 86 . . . reference position mark section (reference position section), 87 . . . check sensor, 89 . . . reference position pin, 91 . . . control device, 95 . . . image processing unit

The invention claimed is:

1. A chuck device comprising:
   a plurality of types of chuck pawls clamping a component;
   a chuck pawl switching mechanism switching the chuck pawls in use among the plurality of types of chuck pawls in accordance with the type of the component to be clamped; and
   a driving mechanism allowing the chuck pawl switched by the chuck pawl switching mechanism to be put into a clamping operation,
   wherein the chuck pawl switching mechanism includes a cylindrical cam, the plurality of types of chuck pawls are placed at predetermined intervals around the cylindrical cam, and the respective chuck pawls are moved upward and downward independently of each other by the cylindrical cam being rotated.

2. The chuck device according to claim 1,
   wherein the chuck pawl switching mechanism retracts the chuck pawl not used among the plurality of types of chuck pawls to a retraction position not interfering with the clamping operation of the chuck pawl in use.

3. The chuck device according to claim 2,
   wherein the plurality of types of chuck pawls are supported such that the respective chuck pawls are moved upward and downward independently of each other, and
   wherein the chuck pawl switching mechanism lifts the chuck pawl not used to the retraction position and lowers the chuck pawl in use to a clamping operation position below the retraction position.

4. The chuck device according to claim 3,
   wherein a cam follower disposed in each of the chuck pawls is fitted into a cam groove in an outer peripheral surface of the cylindrical cam.

5. The chuck device according to claim 4,
   wherein a tubular guide member guiding the upward and downward movement of each of the chuck pawls is concentrically placed on an outer peripheral side of the cylindrical cam, and the respective chuck pawls are moved upward and downward independently of each other by the cylindrical cam being rotated in a state where rotation of the tubular guide member is locked.

6. The chuck device according to claim 1,
   wherein each of the chuck pawls is disposed to be interchangeable with a different type of chuck pawl.

7. The chuck device according to claim 1,
   wherein the driving mechanism is configured to use an air cylinder as a driving source.

8. A component mounting machine comprising a mounting head,
   wherein the chuck device according to claim 1 is interchangeably held by the mounting head.

9. A component mounting machine comprising a mounting head, wherein the chuck device according to claim 7 is interchangeably held by the mounting head, and wherein air pressure is supplied to the air cylinder of the chuck device through an air passage of the mounting head.

10. A component mounting machine comprising a mounting head, wherein the chuck device according to claim 1 is interchangeably held by the mounting head, and wherein the respective chuck pawls are moved upward and downward independently of each other by the cylindrical cam being rotated based on rotation of a rotary shaft of the mounting head.

11. A component mounting machine comprising a mounting head, wherein the chuck device according to claim 5 is interchangeably held by the mounting head, wherein the component mounting machine further comprises a rotation locking member locking the rotation of the tubular guide member when the chuck pawl in use is switched among the plurality of types of chuck pawls of the chuck device, and wherein the respective chuck pawls are moved upward and downward independently of each other by the cylindrical cam being rotated based on rotation of a rotary shaft of the mounting head in a state where the chuck device is moved to a predetermined position by the mounting head and the rotation of the tubular guide member is locked by the rotation locking member.

12. The component mounting machine according to claim 11, further comprising an actuator that moves the rotation locking member, wherein the rotation locking member is moved to a position locking the rotation of the tubular guide member by the actuator during a chuck pawl switching operation for switching the chuck pawl in use among the plurality of types of chuck pawls of the chuck device, and the rotation locking member is retracted to a position not interfering with the chuck device by the actuator after the chuck pawl switching operation is completed.

13. The component mounting machine according to claim 11, wherein a plurality of the chuck devices are held by the mounting head and a plurality of rotary shafts rotating the cylindrical cams of the plurality of chuck devices are disposed in the mounting head, wherein a plurality of the rotation locking members are disposed to correspond to the plurality of chuck devices, and wherein the respective chuck pawls of the plurality of chuck devices are moved upward and downward independently of each other by the cylindrical cams of the plurality of chuck devices being rotated based on rotation of the plurality of rotary shafts of the mounting head in a state where the plurality of chuck devices are moved to a predetermined position by the mounting head and the rotation of the tubular guide members of the plurality of chuck devices is locked by the plurality of rotation locking members.

14. The component mounting machine according to claim 11, further comprising:

a camera imaging an imaging target; and imaging circuitry configured to recognize a position of the rotation locking member by imaging the rotation locking member or a reference position section disposed with a certain positional relationship with the rotation locking member with the camera and processing the image.

15. The component mounting machine according to claim 8, further comprising a check sensor checking the chuck pawl switched by the chuck pawl switching mechanism.

* * * * *

UNITED STATES PATENT AND TRADEMARK OFFICE
CERTIFICATE OF CORRECTION

| | | |
|---|---|---|
| PATENT NO. | : 10,172,269 B2 | Page 1 of 1 |
| APPLICATION NO. | : 15/025668 | |
| DATED | : January 1, 2019 | |
| INVENTOR(S) | : Junichi Yamamuro | |

It is certified that error appears in the above-identified patent and that said Letters Patent is hereby corrected as shown below:

On the Title Page

Item (71), the Applicant's information is incorrect. Item (71) should read:
--(71) Applicant: FUJI CORPORATION, Chiryu (JP)--

Signed and Sealed this
Eighteenth Day of February, 2020

Andrei Iancu
*Director of the United States Patent and Trademark Office*